(12) United States Patent
Song

(10) Patent No.: US 7,034,368 B2
(45) Date of Patent: Apr. 25, 2006

(54) SEMICONDUCTOR MEMORY DEVICE AND FABRICATION METHOD THEREOF USING DAMASCENE GATE AND EPITAXIAL GROWTH

(75) Inventor: Du-Heon Song, Gyeonggi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/001,355

(22) Filed: Nov. 30, 2004

(65) Prior Publication Data

US 2005/0151274 A1    Jul. 14, 2005

Related U.S. Application Data

(62) Division of application No. 10/456,087, filed on Jun. 6, 2003, now Pat. No. 6,844,233.

(30) Foreign Application Priority Data

Jul. 12, 2002    (KR) ............... 2002-40860

(51) Int. Cl.
*H01L 31/062* (2006.01)
*H01L 29/94* (2006.01)

(52) U.S. Cl. .............. 257/390; 257/346; 438/279; 438/486

(58) Field of Classification Search ........ 257/346, 257/389, 390, 410
See application file for complete search history.

(56) References Cited

U.S. PATENT DOCUMENTS

| 5,631,185 A | 5/1997 | Kim et al. |
| 6,030,894 A | 2/2000 | Hada et al. |
| 6,417,055 B1 | 7/2002 | Jang et al. |
| 6,515,338 B1 | 2/2003 | Inumiya et al. |

FOREIGN PATENT DOCUMENTS

JP    10-242411    9/1998

OTHER PUBLICATIONS

English language abstract of the Japanese Publication No. 10-242411.

*Primary Examiner*—Michael Trinh
*Assistant Examiner*—Pamela E Perkins
(74) *Attorney, Agent, or Firm*—Marger Johnson & McCollom, P.C.

(57) ABSTRACT

A semiconductor memory device and fabrication method of same includes the processes of forming sacrifice gates on a silicon substrate with the sacrifice gates apart from each other. A first conductive layer is formed on an exposed portion of the silicon substrate between the sacrifice gates and a first inter-insulation layer is formed that exposes the first conductive layer and the sacrifice gates. The exposed sacrifice gates are removed to form openings and damascene gates are subsequently formed in the openings. Capping layers are formed on the top of the gates and a second conductive layer is formed on the exposed first conductive layer. A second inter-insulation layer is formed on the silicon substrate, and bit line contacts that expose the second conductive layer are formed by etching the second inter-insulation layer.

18 Claims, 13 Drawing Sheets

US 7,034,368 B2

SEMICONDUCTOR MEMORY DEVICE AND FABRICATION METHOD THEREOF USING DAMASCENE GATE AND EPITAXIAL GROWTH

CROSS REFERENCE TO RELATED APPLICATIONS

This application is a divisional of U.S. patent application Ser. No. 10/456,087, filed Jun. 6, 2003, now U.S. Pat. No. 6,844,233, which is herein incorporated by reference in its entirety.

BACKGROUND OF THE INVENTION

1. Technical Field of the Invention

This disclosure relates to a semiconductor memory device, and more particularly, to a semiconductor memory device and a fabrication method thereof using a damascene gate process and a silicon epitaxial process to prevent a pad bridge due to a void of an inter-insulation layer, to reduce a contact resistance, and to ensure a sufficient overlay margin of a bit-line contact.

2. Description of the Related Art

Generally, as the size of semiconductor devices is reduced, the cell pitch is reduced as well. As the cell pitch is reduced, voids are generated due to gap-fill failures in inter-insulation layers, open-failures in cell contacts are generated, the contact resistance of individual cells are increased, and the overlay margin in a bit-line contact is reduced.

FIGS. 1A to 4A are cross-sectional views illustrating a fabrication process of a conventional semiconductor memory and FIGS. 1B, 2B, 3B, and 4B are plan views illustrating a fabrication process for the conventional semiconductor memory device, wherein FIGS. 1A, 2A, 3A, and 4A are cross-sectional views taken along a line IA–IA' in FIG. 4B.

Referring to FIGS. 1A and 1B, a semiconductor substrate 100 is divided into a field region 101 and an active region 105. A conventional shallow trench isolation STI process is performed to form a field isolation region 110 in the field region 101 of the semiconductor substrate 100.

Referring to FIGS. 2A and 2B, a gate 120 crossing over the active region 105 is formed on the substrate 100. In other words, on the substrate 100, a gate insulation layer 121, a polysilicon layer 123, a tungsten (W) layer 125, and a cap nitride layer 127 are deposited sequentially and patterned using a gate mask (not shown) to form the gate 120. Spacers 130 composed of a nitride layer are formed on the sidewalls of the gate 120.

Referring to FIGS. 3A and 3B, a first inter-insulation layer 140 is deposited on the substrate 100 and a conventional self-aligned contact process is performed to form self-aligned contacts (SACs) 150. Sequentially, a conductive layer for a SAC contact pad, such as a polysilicon layer, is deposited and a chemical and mechanical polishing CMP process or an etch-back process is performed to form SAC contact pads 160.

Referring to FIGS. 4A and FIG. 4B, a second inter-insulation layer 170 is deposited on the substrate 100 and patterned to form a bit-line contact 180. The bit-line contact exposes the corresponding contact pad of the SAC contact pads 160 which is to be connected with a bit-line in a subsequent process. In other conventional processes, such as processes for forming bit-lines, storage node contacts, capacitors, and metal interconnections, the steps are performed sequentially to fabricate the conventional dynamic random access memory DRAM device.

However, the conventional DRAM device fabrication method has the following problems due to the reduction of the cell pitch according to the size reduction of the DRAM device.

First, when gap-filling with the first inter-insulation layer occurs, a void due to a gap-fill failure may cause a bridge-failure between the pads. Secondly, the open area of the SAC contact 150 is reduced, generating an open-failure, and the cell contact resistance may increase due to the reduction in the contact area between the SAC contact pad 160 and the active region 105 caused by the surface treatment. Thirdly, the thickness of the gate spacer 130 is reduced, generating a leakage current between the gate 120 and the SAC contact pad 160. Finally, the overlay margin of the bit-line contact 180 is reduced.

Embodiments of the invention address these and other disadvantages of the conventional art.

SUMMARY OF THE INVENTION

Embodiments of the invention provide a semiconductor memory device and a fabrication method thereof using a damascene gate process and a silicon epitaxial process that prevents bridge-failures between pads due to voids in the inter-insulation layer.

Other embodiments of the invention provide a semiconductor memory device and a fabrication method thereof where forming a gate spacer with a gate insulation layer having an excellent dielectric characteristic prevents a leakage current between a gate and a contact pad.

Still other embodiments of the invention provide a semiconductor memory device and a fabrication method thereof that prevents a contact open failure and an increase of the contact resistance due to the reduction of an open area and a surface treatment.

Still other embodiments of the invention ensure a sufficient overlay margin for the bit-line contacts.

To achieve the goals and objectives discussed above as well as others not mentioned, preferred embodiments of the invention provide a semiconductor memory device that include gates formed on a silicon substrate and having a capping layer, an insulation layer formed on bottom and side walls of each gate, a first conductive layer enclosed by the insulation layer and formed between the gates, a first inter-insulation layer fabricated on the silicon substrate to expose the first conductive layer and the gates, a second conductive layer formed on the exposed first conductive layer, and a second inter-insulation layer formed on the silicon substrate to include a bit-line contact exposing the second conductive layer.

Preferably, the first conductive layer and the second conductive layer are epitaxial silicon layers that function as contact pads and the second conductive layer has a semi-spherical shape that overlaps with the exposed gates. The insulation layer is a thermal oxidation layer or a high dielectric layer. Preferably, a portion on the bottom of the gate is a gate insulation layer and the other portion between the gate and the first conductive layer is a gate spacer, wherein the thickness difference between the gate insulation layer and the gate spacer is within 7 nm.

Furthermore, embodiments of the invention provide a fabrication method for a semiconductor memory device that includes the processes of forming sacrifice gates on a silicon substrate, the sacrifice gates located apart from each other. The method also includes forming a first conductive layer on an exposed portion of the silicon substrate between the sacrifice gates, forming a first inter-insulation layer to expose the first conductive layer and the sacrifice gates, removing the exposed sacrifice gates to form openings, and forming gates in the openings. The method also includes forming capping layers on the top of the gates, forming a second conductive layer on the exposed first conductive layer, forming a second inter-insulation layer on the silicon substrate, and etching the second inter-insulation layer to form a bit-line contact exposing the second conductive layer.

Preferably, the sacrifice gates include a nitride layer. The first conductive layer is a silicon layer that is preferably grown through anisotropic epitaxial growth. The second conductive layer is a silicon layer that is preferably grown through an isotropic epitaxial growth, and has a semi-spherical shape to overlap with the gates.

Preferably, the gate formation method includes the processes of forming an insulation layer on the silicon substrate, depositing a gate electrode material on the insulation layer, and etching the gate electrode material and the insulation layer through a chemical mechanical polishing process. The insulation layer is formed on a bottom and a sidewall of the gate and encloses the first conductive layer, wherein the insulation layer includes an oxide layer deposited by a thermal oxidation process or other deposition process, or alternatively a high dielectric layer deposited by a deposition process.

Preferably, the capping layer formation process includes the processes of: etching a portion of the gate; depositing an insulation layer on the silicon substrate; and etching-back the insulation layer to form the capping layer.

BRIEF DESCRIPTION OF THE DRAWINGS

For a more complete understanding of the invention and the advantages thereof, reference is now made to the following description taken in conjunction with the accompanying drawings, in which like reference numerals denote like parts.

DETAILED DESCRIPTION OF THE INVENTION

Reference will now be made in detail to some preferred embodiments of the invention, examples of which are illustrated in the accompanying drawings.

FIGS. 5 through 13 illustrate fabrication processes in accordance with an embodiment of the invention, where the "A" portions of the FIGURES are cross sectional views and the "B" portions of the FIGURES are plan views corresponding to the cross-sectional view shown in the same FIGURE. The cross-sectional views of FIGS. 5A through 13A are taken along a line IIA–IIA' in FIG. 13B.

Figure 1A:
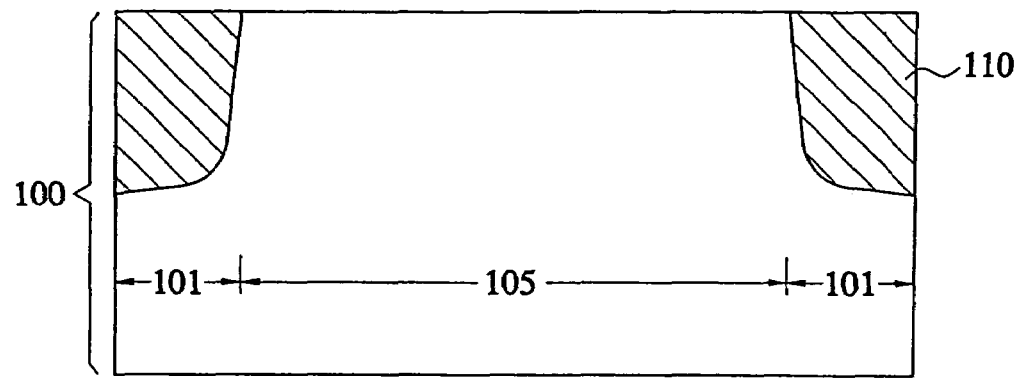
FIGS. 1A, 2A, 3A, and 4A are cross sectional views illustrating processes for fabricating a conventional semiconductor memory device.
Figure 1B:
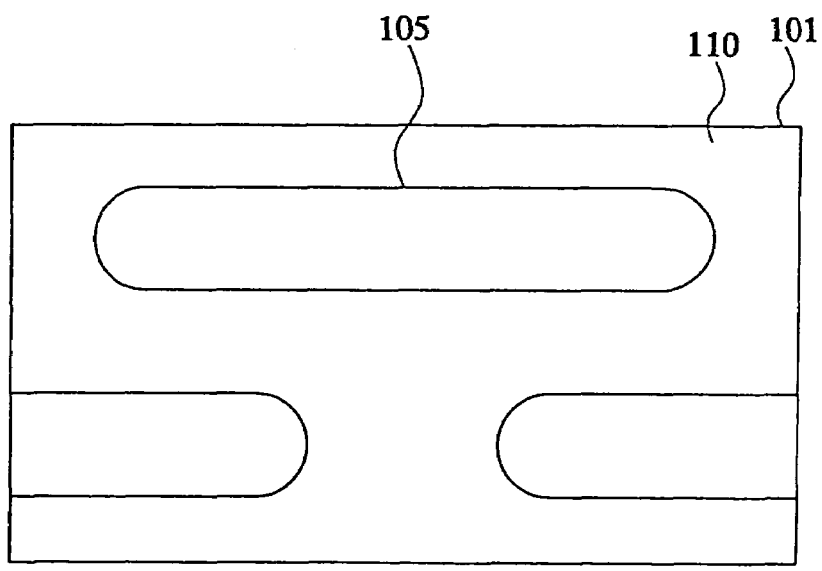
FIGS. 1B, 2B, 3B, and 4B are plan views illustrating processes for fabricating a conventional semiconductor memory device.
Figure 2A:
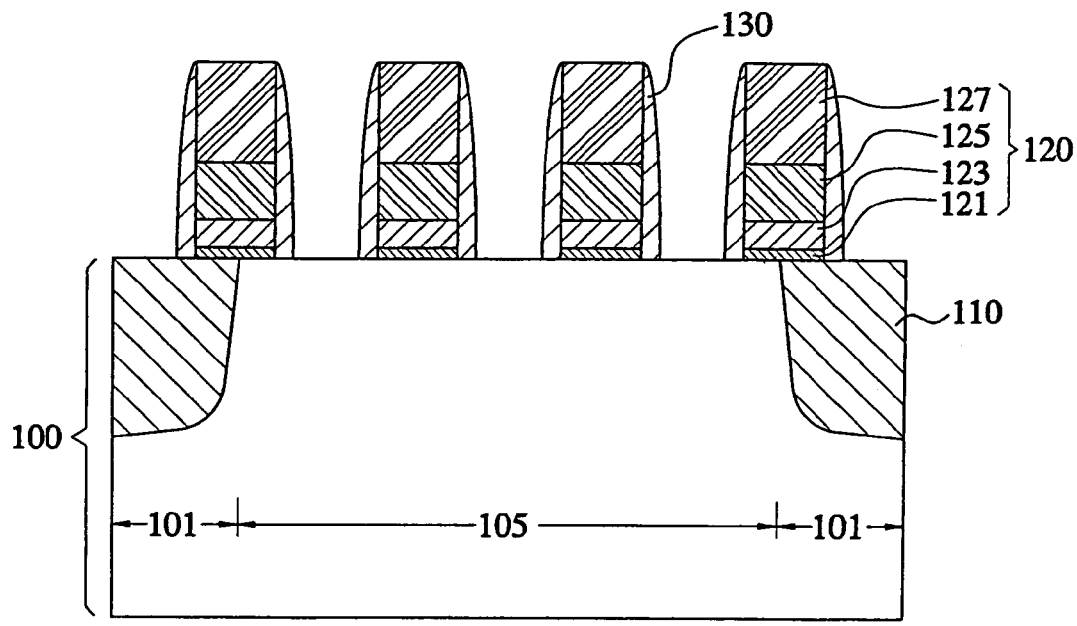
Figure 2B:
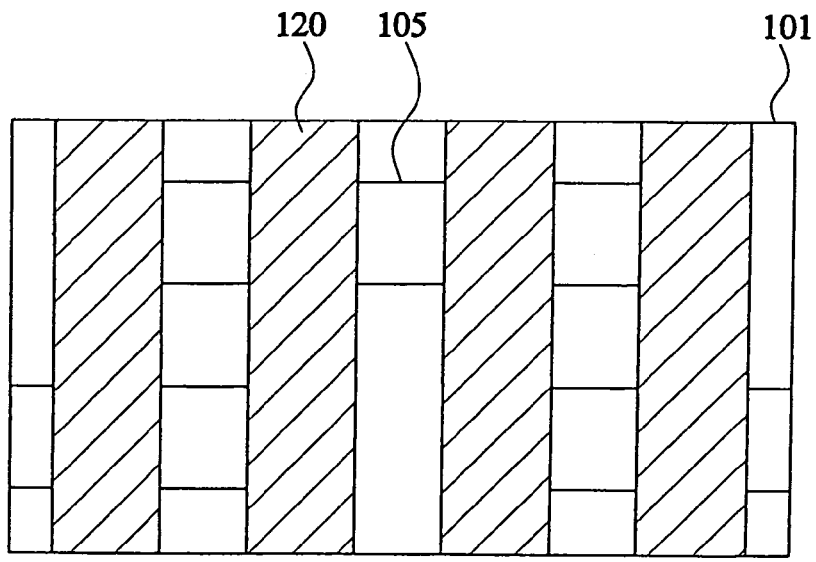
Figure 3A:
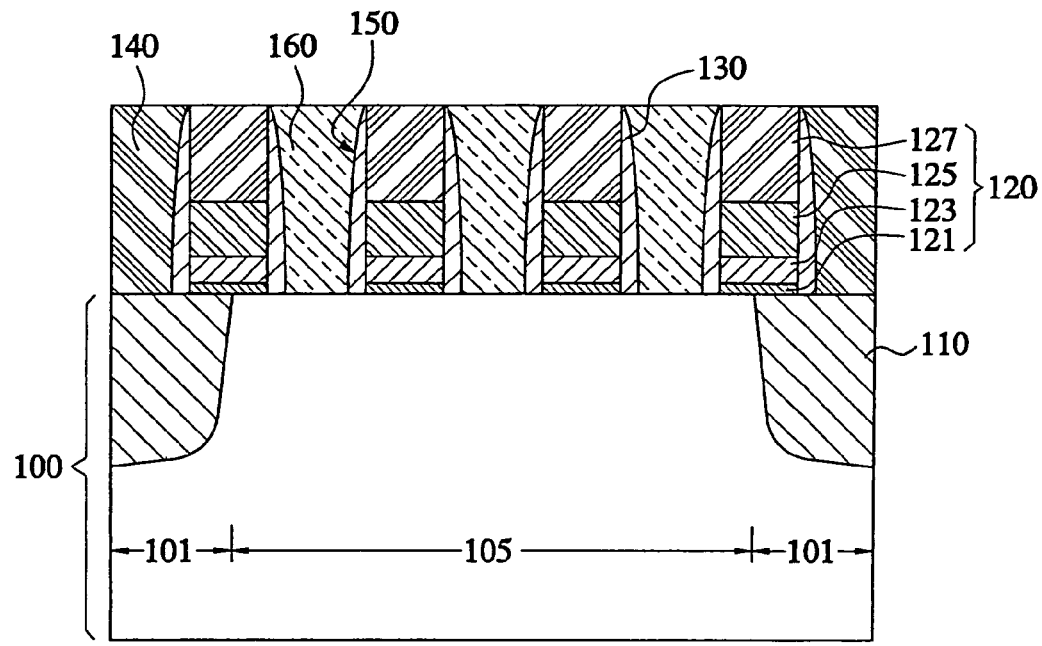
Figure 3B:
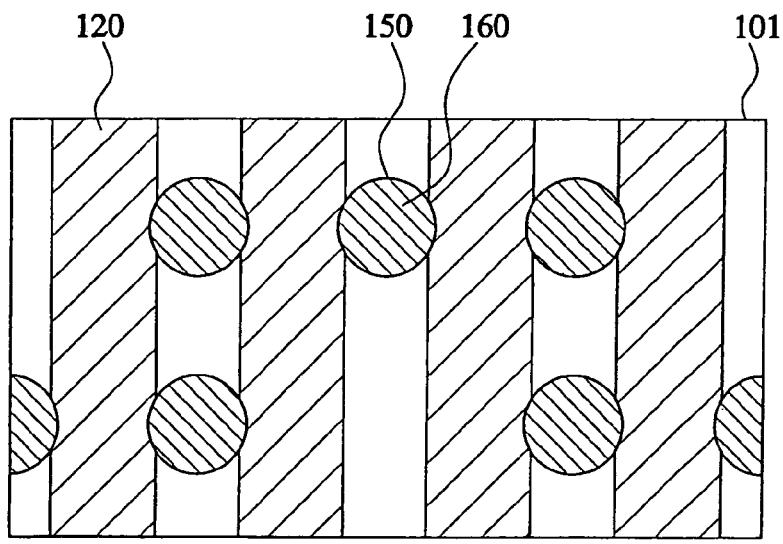
Figure 4A:
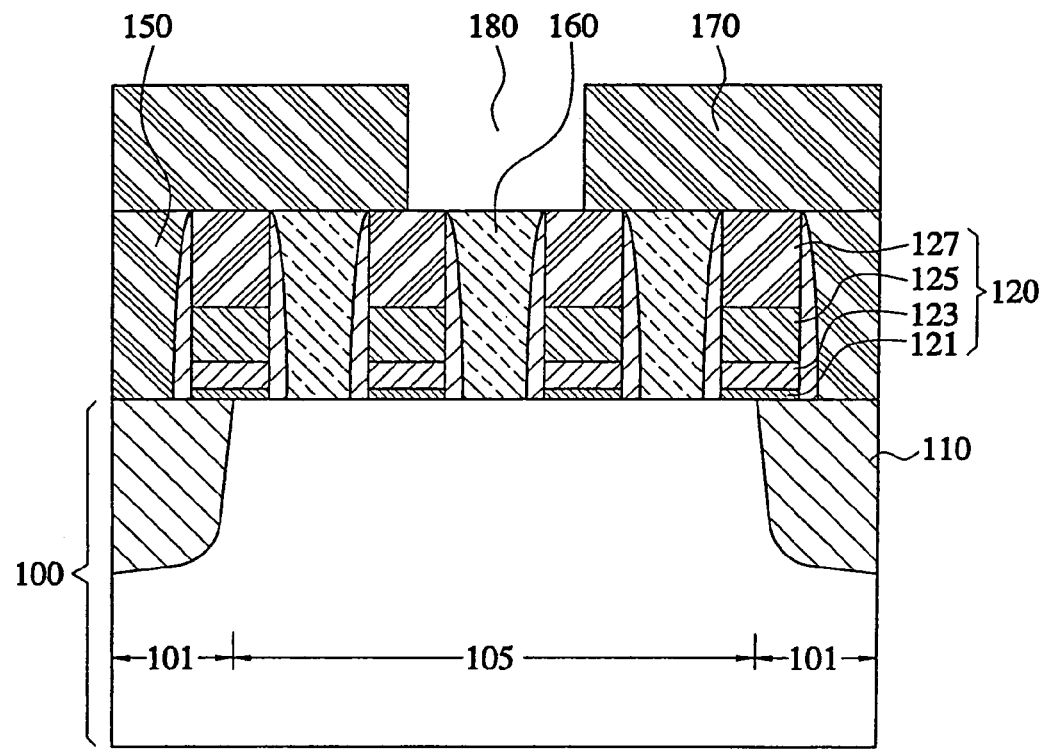
Figure 4B:
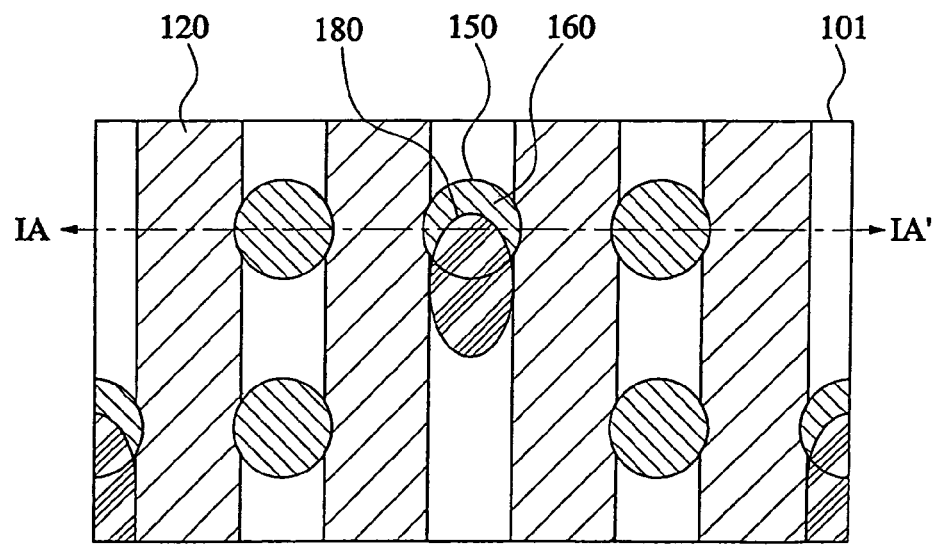
Figure 5A:
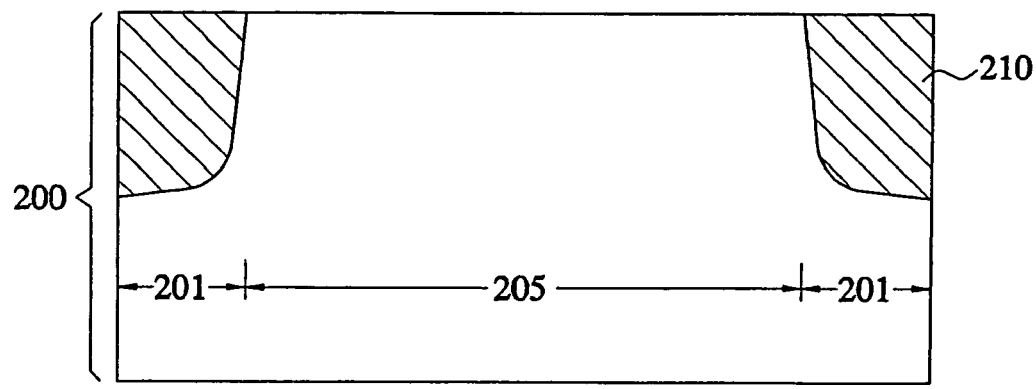
FIGS. 5A, 6A, 7A, 8A, 9A, 10A, 11A, 12A, and 13A are cross sectional views illustrating fabrication processes of a semiconductor memory device in accordance with an embodiment of the invention.
Figure 5B:
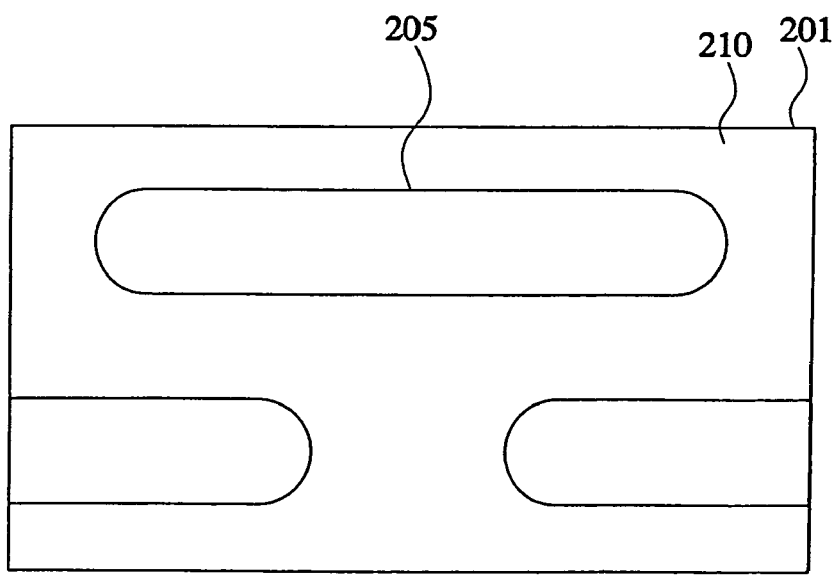
FIGS. 5B, 6B, 7B, 8B, 9B, 10B, 11B, 12B, and 13B are plan views illustrating fabrication processes of a semiconductor memory device in accordance with an embodiment of the invention.

Referring to FIGS. 5A and 5B, a silicon substrate 200 includes a field region 201 and an active region 205. A conventional shallow trench isolation STI process is performed to form a STI field isolation region 210. The field isolation region 210 isolates an active region 205 from the other adjacent active regions 205.

Figure 6A:
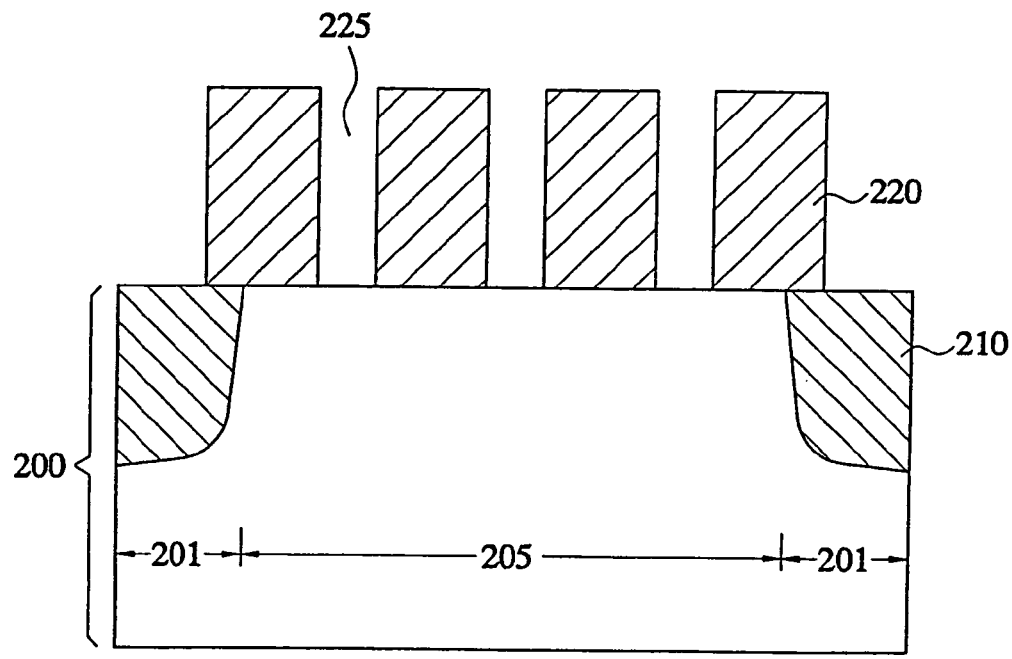
Figure 6B:
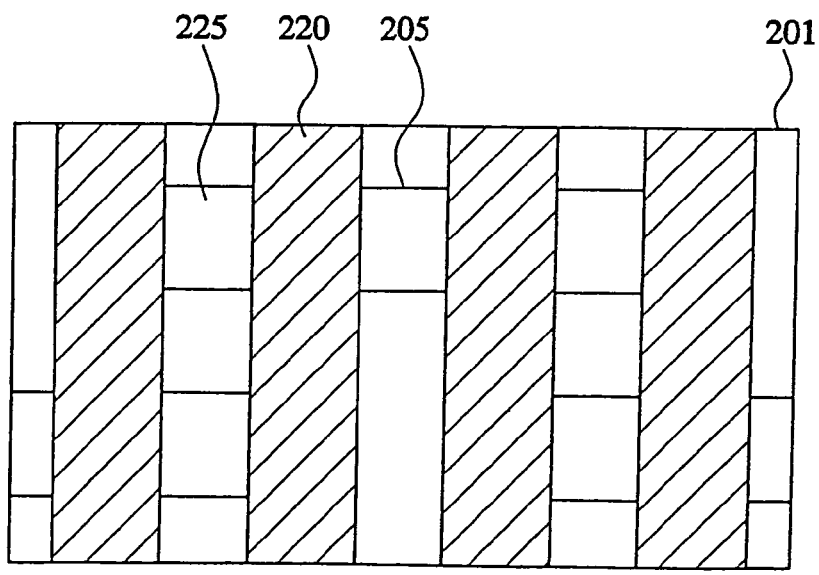

Referring to FIGS. 6A and 6B, an oxide layer for a sacrifice gate insulation layer is formed on the silicon substrate 200 through a sacrifice oxidation process, and a nitride layer is deposited on the oxide layer. The nitride layer and the oxide layer is patterned to form sacrifice gates 220 that include a sacrifice gate insulation layer (not shown). In this case, the sacrifice gates 220 are formed to cross the active region 205 and to have the same shape as gates that are formed in subsequent process. According to the formation of the sacrifice gates 220, openings 225 are formed to expose portions of the active region 205. The openings 225 correspond to contacts where contact pads for a bitline and a capacitor will be formed.

Figure 7A:
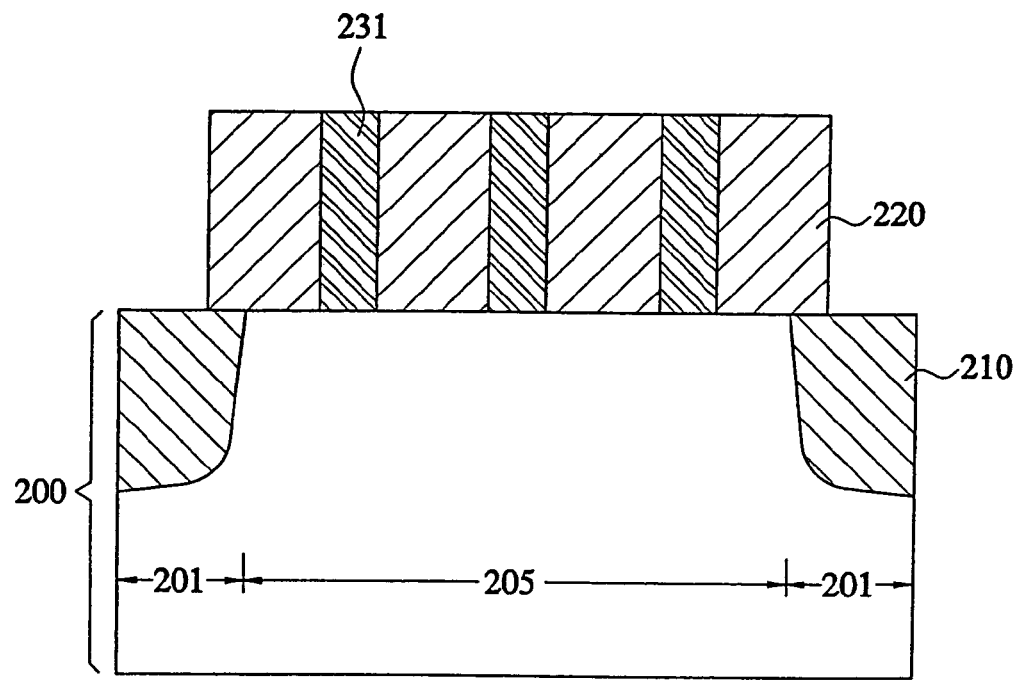
Figure 7B:
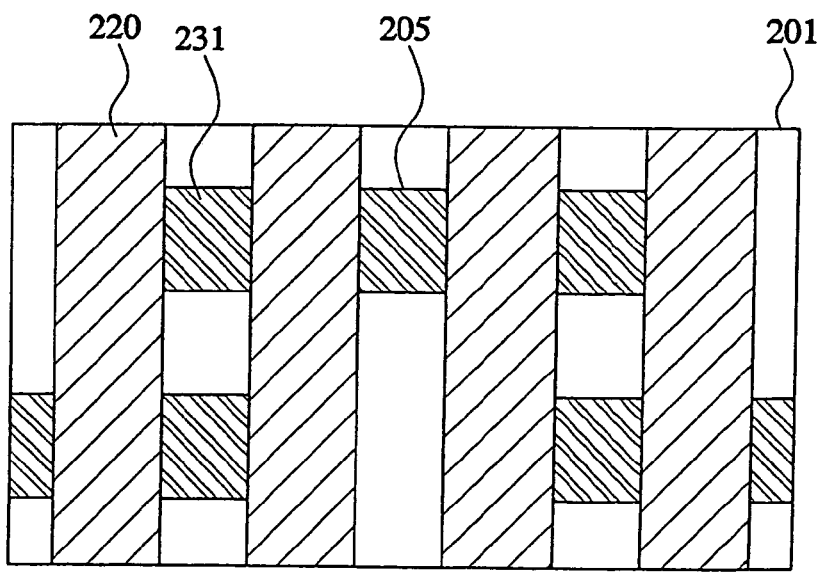
Figure 8A:
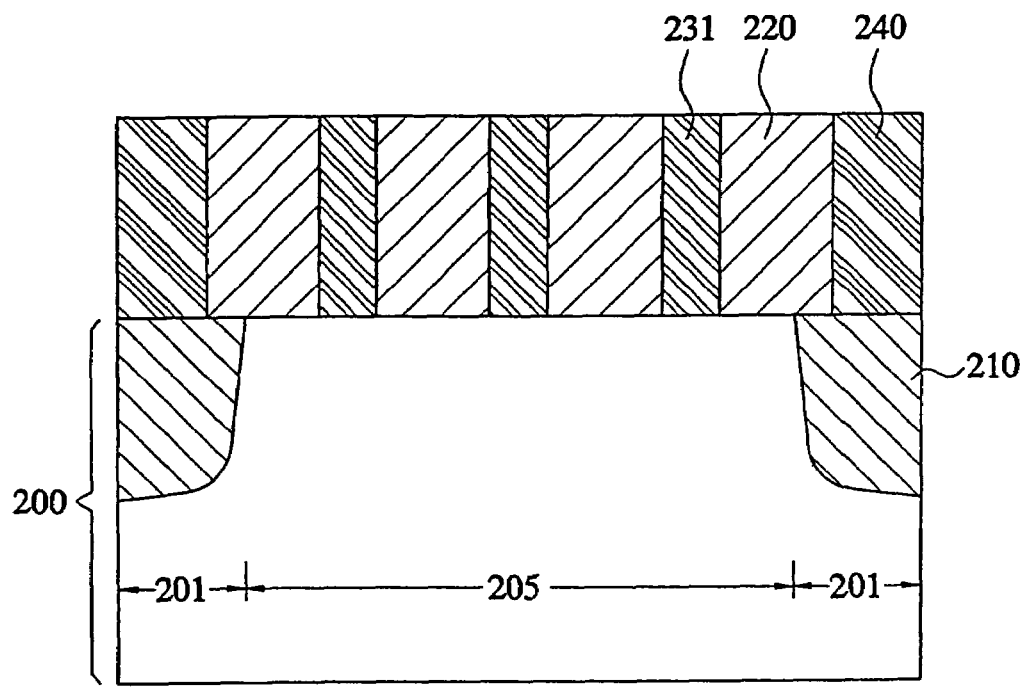
Figure 8B:
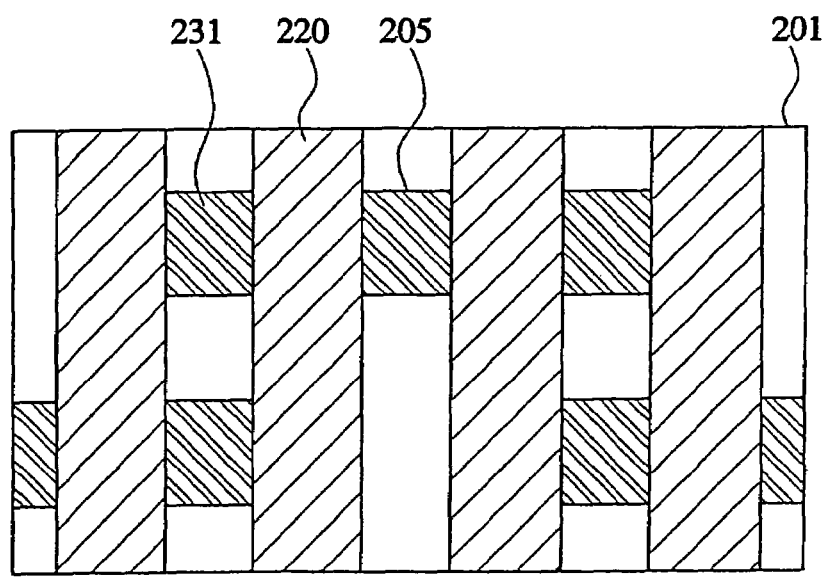

Referring to FIGS. 7A and 7B, on the portions of the active region 205 exposed by the openings 225, a first silicon layer 231 for a contact pad is formed by an anisotropic epitaxial growth process. Referring to FIGS. 8A and 8B, a first inter-insulation layer 240 is deposited on the silicon substrate 200, and a chemical mechanical polishing CMP process is performed to planarize the first inter-insulation layer 240. In a preferred embodiment of the invention, following the formation of the first silicon layer 231 for the contact pad, the first inter-insulation layer 240 is formed to prevent bridge-failures between pads due to voids in the inter-insulation layer. Additionally, this prevents open-failures due to the reduction of the contact open area, inhibits the increase of the contact resistance due to surface treatment, and minimizes contact area reduction between the active region 205 and the contact pad.

Figure 9A:
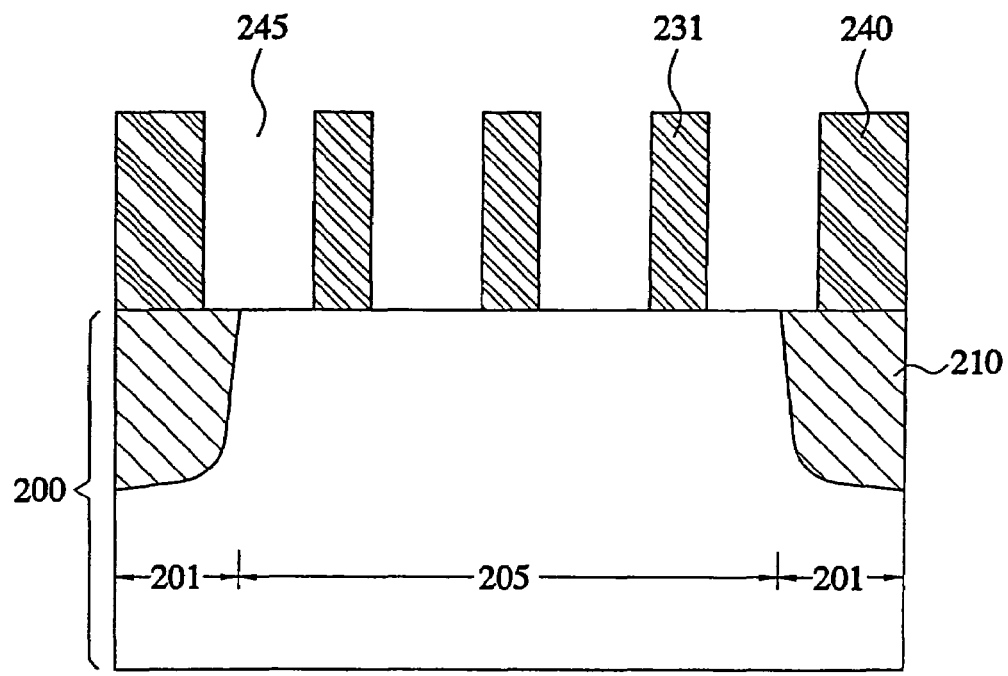
Figure 9B:
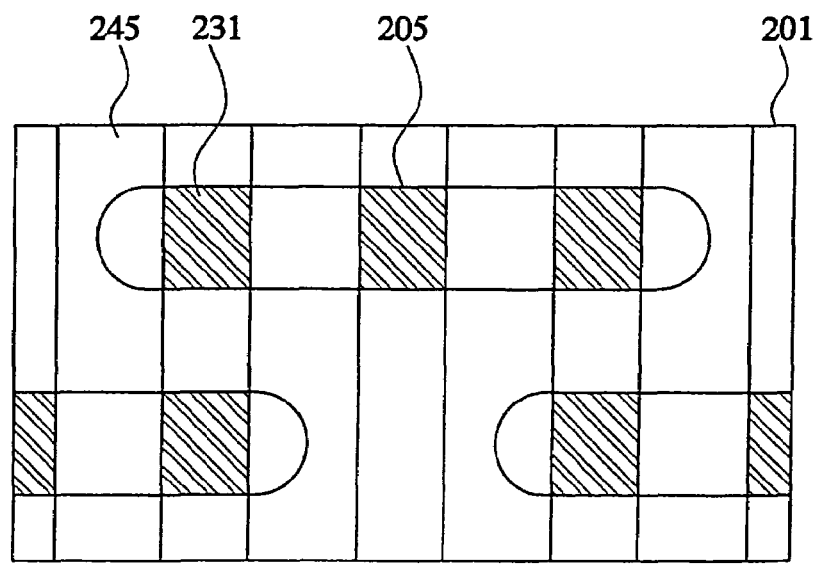
Figure 10A:
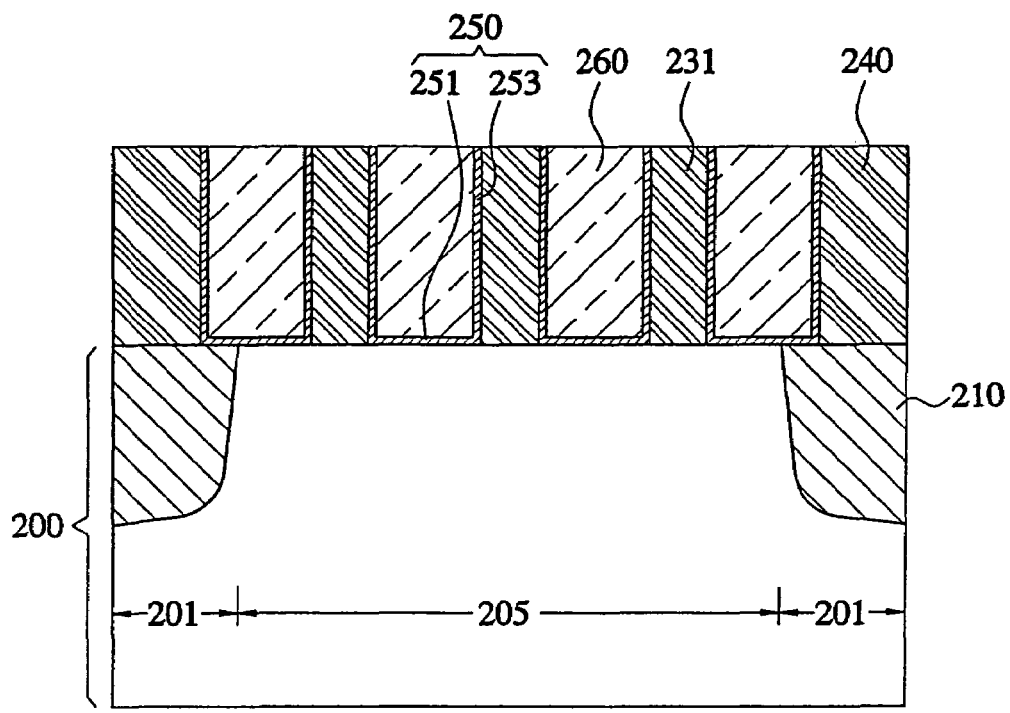
Figure 10B:
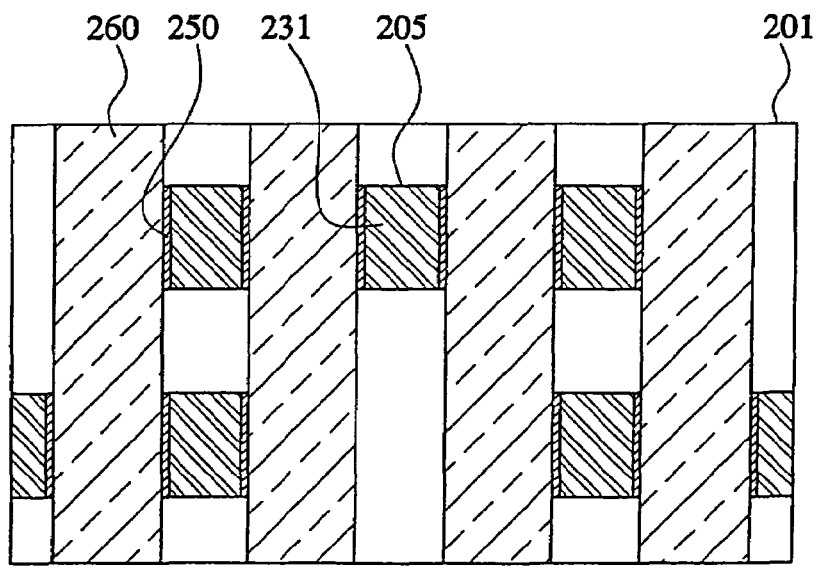

Referring to FIGS. 9A and 9B, by removing the sacrifice gates 220 including the sacrifice gate insulation layer, openings 245 are formed. Referring to FIGS. 10A and 10B, an oxide layer 250 is grown through a thermal oxidation process, and a gate electrode material is deposited over the whole surface of the substrate 200. The gate electrode material is etched through a CMP process to form damascene gates 260 in the openings 245 which are formed by eliminating the sacrifice gates 220. The oxide layer 250 encloses both sidewalls of the damascene gates 260 and encloses the first silicon layer 231.

Alternatively, the damascene gates 260 may have different structures, such as a stack structure including a polysilicon layer and a tungsten metal layer, or a stack structure including a polysilicon layer and a silicide layer. Instead of a thermal oxidation process, a deposition process may be used to fabricate the oxide layer 250. Furthermore, a high dielectric layer such as aluminum oxide ($Al_2O_3$), hafnium oxide ($HfO_2$), zirconium oxide ($ZrO_2$), or tantalum oxide ($Ta_2O_5$) may be deposited instead of the oxide layer 250.

Of the oxide layer 250, a portion 251 on the bottom of the gate 260 serves as a gate insulation layer, and a portion 253 on the sidewall of the gate 260 serves as a gate spacer. The thickness of the oxide layer 250 is 10 to 100 Å. The thickness difference between the portion 251 and the portion 253 of the oxide layer 250 is under 7 nm. Although the oxide layer 250 is simultaneously formed on the bottom and sidewall of the gate 260 through a thermal oxidation process or a deposition process, there is a thickness difference between the portions 251 and 253 of the oxide layer 250. This difference is caused by the oxidation rate while performing a thermal oxidation process due to different doping concentrations between the silicon substrate 200 and the first silicon layer 231. In other words, it is caused by the step coverage between the silicon substrate 200 and the first silicon layer 231 during the deposition process.

In preferred embodiments of the invention, the gate insulation layer and the gate spacer including the oxide layer 250 are simultaneously formed to have the same thickness. Besides, the gate spacer 253 is formed with a thermal oxidation layer that has an excellent dielectric characteristic as the gate insulation layer to prevent a leakage current between the gate 260 and a contact pad in the following process.

Figure 11A:
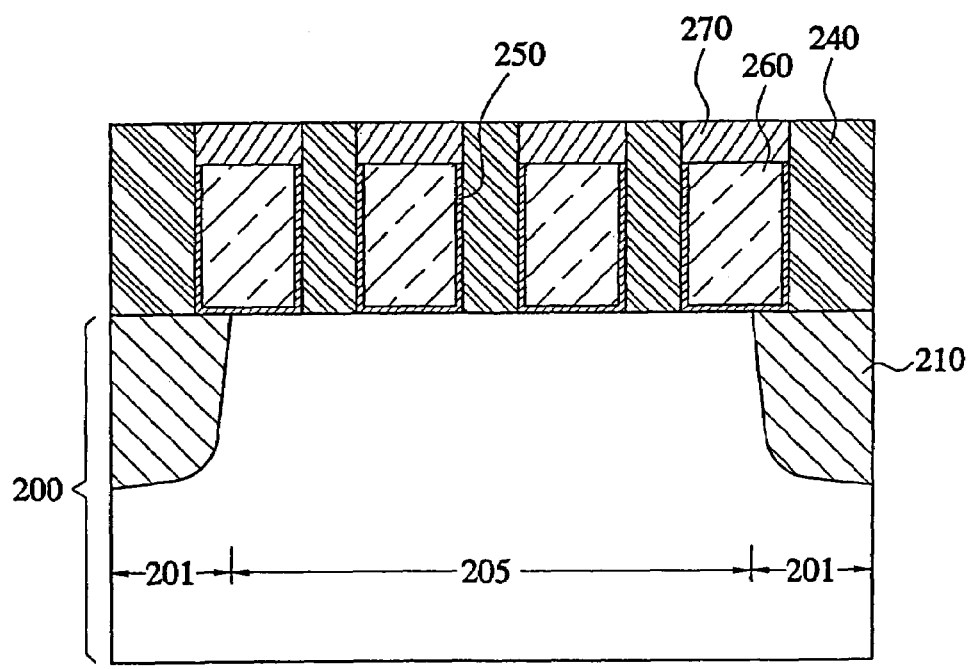
Figure 11B:
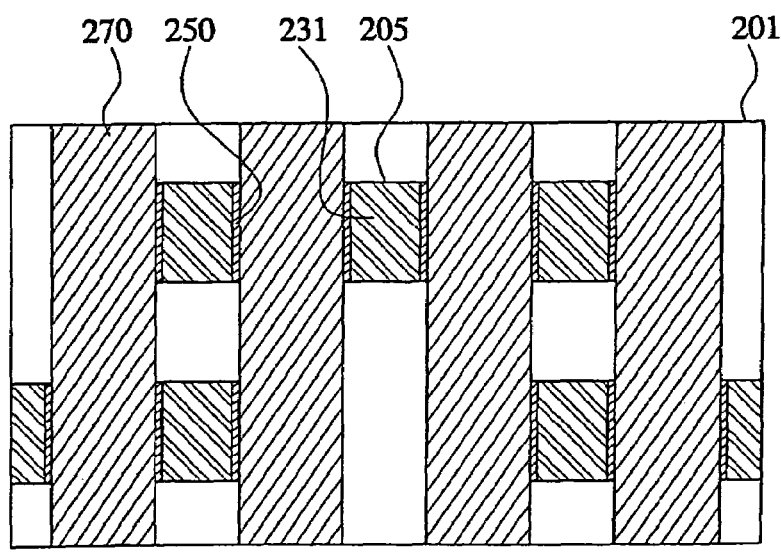

Referring to FIGS. 11A and 11B, a portion of the gate 260 is etched-back. An insulation layer, such as an oxide layer or a nitride layer, is deposited, and subsequently etched through a CMP process to form a capping layer 270 on the top of the gate 260.

Figure 12A:
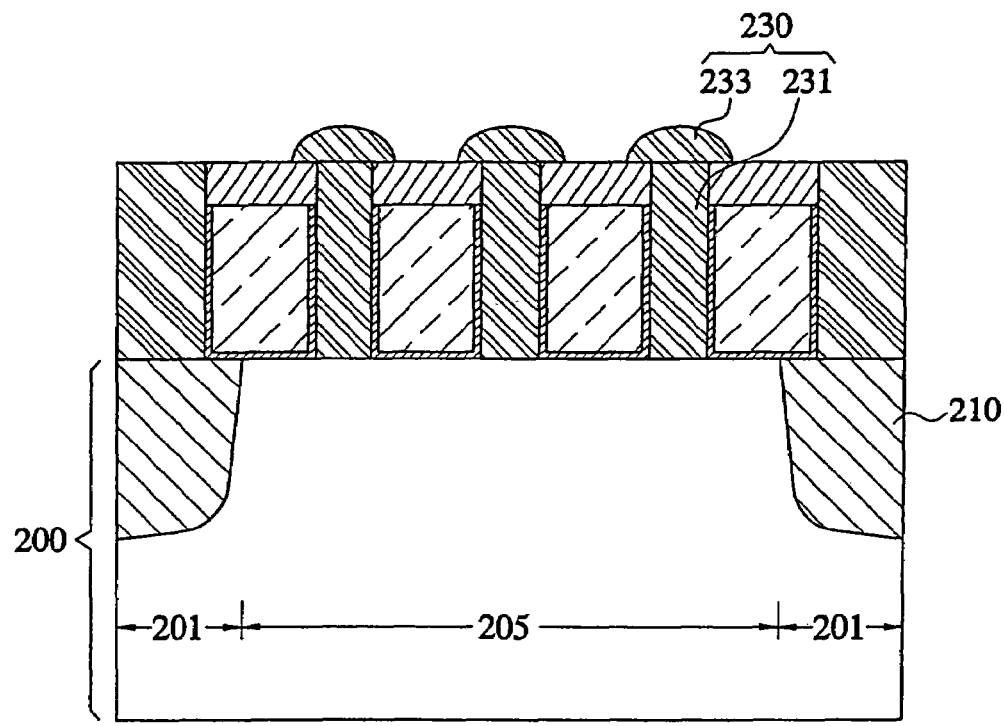
Figure 12B:
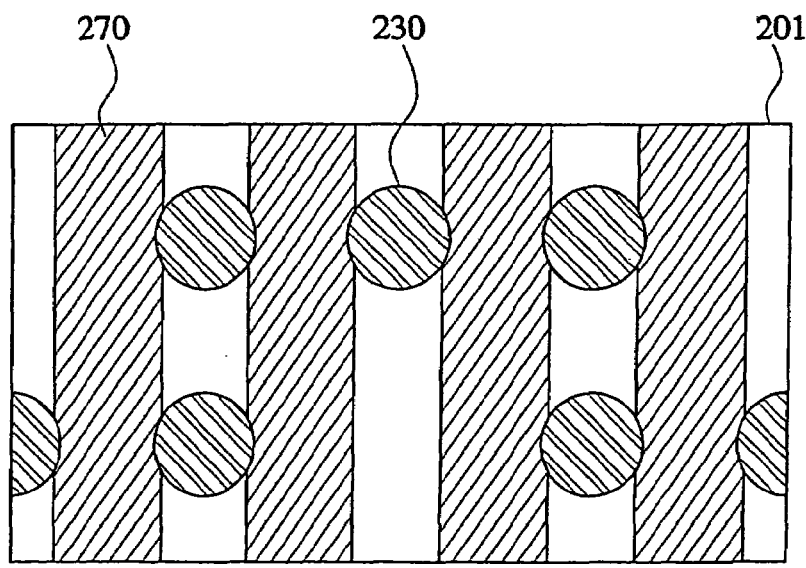

Referring to FIGS. 12A and 12B, a second silicon layer 233 is grown on the first silicon layer 231 by an isotropic growth to form contact pads 230. The contact pad 230 includes the first silicon layer 231 and the second silicon layer 233. Because the second silicon layer 233 is grown in an isotropic epitaxy process to have a semi-spherical shape, the lateral extent of the contact pad 230 is more than the lateral extent of the opening 225 (from FIG. 6A) and overlaps the gates 260. Therefore, in the following bit-line contact process, a sufficient overlay margin can be ensured.

Figure 13A:
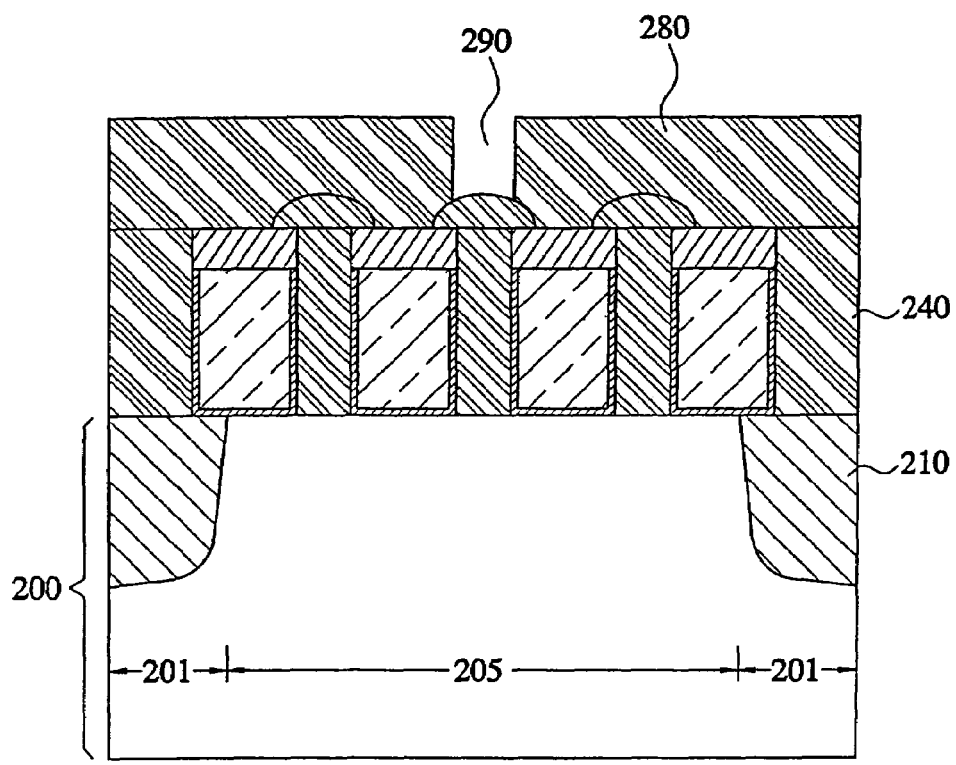
Figure 13B:
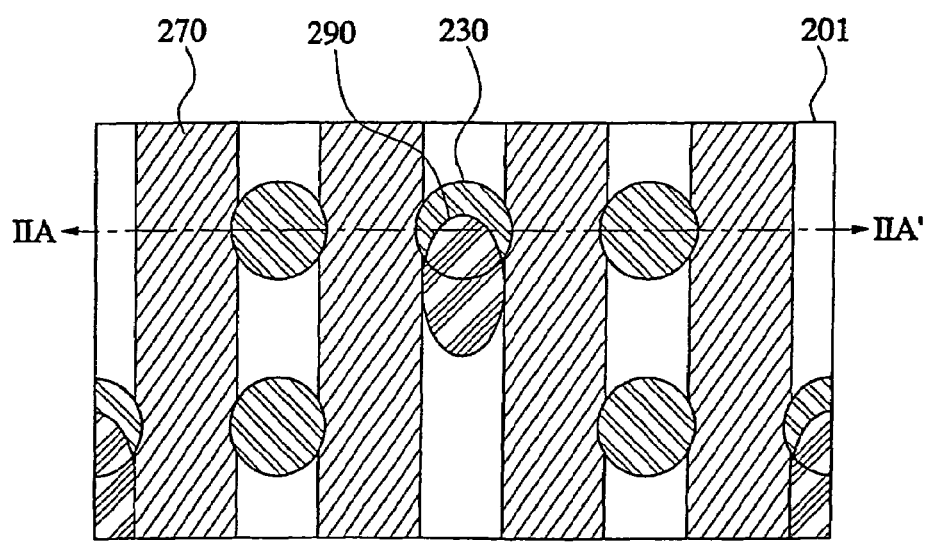

Referring to FIGS. 13A and 13B, the second inter-insulation layer 280 is deposited on the silicon substrate and then etched to form a bit-line contact 290 exposing the corresponding contact pad of the contact pads 230 that will be connected with a bit-line in a subsequent process.

Although not shown in the drawings, bit-lines, storage node contacts, capacitors, and metal lines are subsequently formed to fabricate a DRAM device according to this embodiment of the invention.

As described above, embodiments of the invention prevent voids due to a gap-fill failure in the inter-insulation layer by epitaxial-growth of a silicon layer for a contact pad and then forming the inter-insulation layer. It prevents open-failures due to the reduction of the contact open area and prevents reduction in a contact resistance due to the reduction of the contact area between the active region and the contact pad during surface treatment. It also improves an overlay margin of the bit-line contact.

While the invention has been particularly shown and described with reference to preferred embodiments thereof, it will be understood by those skilled in the art that the foregoing and other changes in form and details may be made therein without departing from the spirit and scope of the invention.

The invention claimed is:

1. A semiconductor memory device comprising:
a plurality of gates formed on a silicon substrate, each gate having a capping layer;
an insulation layer formed on a bottom and a side wall of each gate;
a first conductive layer formed on the silicon substrate between the gates and separated from the gates by the insulation layer;
a first inter-insulation layer formed on the silicon substrate and structured to expose the first conductive layer and the gates;
a second conductive layer formed on the first conductive layer; and
a second inter-insulation layer formed on the silicon substrate and comprising a bit-line contact structured to expose the second conductive layer.

2. The semiconductor memory device according to claim 1, wherein the second conductive layer has a semi-spherical shape and overlaps adjacent ones of the plurality of gates.

3. The semiconductor memory device according to claim 1, wherein the first conductive layer and the second conductive layer are epitaxial silicon layers that function as a contact pad.

4. The semiconductor memory device according to claim 1, wherein the insulation layer comprises a thermal oxidation layer.

5. The semiconductor memory device according to claim 1, wherein the insulation layer comprises a high dielectric layer.

6. The semiconductor memory device according to claim 1, wherein the insulation layer formed on the bottom of each gate is structured as a gate insulation layer and the insulation layer formed on the sidewall of each gate is structured as a gate spacer, wherein the thickness difference between the gate insulation layer and the gate spacer is less than 7 nm.

7. A semiconductor memory device comprising:
two gate structures, each of the two gate structures including a gate electrode disposed over a semiconductor substrate, an insulation layer disposed between the gate electrode and the semiconductor substrate and disposed on sidewalls of the gate electrode, and a gate capping layer disposed on the gate electrode and the insulation layer;
a contact pad, the contact pad including a first conductive layer disposed on the silicon substrate between the two gate structures, the contact pad further including a second conductive layer disposed on the first conductive layer; and
an insulation structure, the insulation structure including a first inter-insulation layer disposed on the semiconductor substrate to either side of the two gate structures, the insulation structure further including a second inter-insulation layer disposed on the two gate structures, on the second conductive layer, and on the first inter-insulation layer, the insulation structure further including a bit line contact configured to expose the second conductive layer through the second-inter insulation layer.

8. The semiconductor memory device of claim 7, the second conductive layer further disposed on the gate capping layer of each of the two gate structures, an upper surface of the second conductive layer having a rounded shape.

9. The semiconductor memory device of claim 7, the first conductive layer and the second conductive layer comprising epitaxial silicon layers.

10. The semiconductor memory device of claim 7, the insulation layer comprising a thermal oxidation layer.

11. The semiconductor memory device of claim 7, the insulation layer comprising a high dielectric layer.

12. The semiconductor memory device according to claim 7, the insulation layer comprising a gate insulation layer disposed between the gate electrode and the semiconductor substrate and a gate spacer disposed on sidewalls of the gate electrode, wherein a thickness difference between the gate insulation layer and the gate spacer is less than 7 nm.

13. A semiconductor memory device comprising:
at least two gate structures, each of the at least two gate structures including a gate electrode disposed over a semiconductor substrate, an insulation layer disposed between the gate electrode and the semiconductor substrate and disposed on sidewalls of the gate electrode, and a gate capping layer disposed on the gate electrode and the insulation layer;

at least one contact pad, the at least one contact pad including a first conductive layer disposed on the silicon substrate between adjacent ones of the at least two gate structures, the at least one contact pad further including a second conductive layer disposed on the first conductive layer; and an insulation structure, the insulation structure including a first inter-insulation layer disposed on the semiconductor substrate to either side of the at least two gate structures, the insulation structure further including a second inter-insulation layer disposed on the at least two gate structures, on the at least one contact pad, and on the first inter-insulation layer, the insulation structure further including a bit line contact configured to expose at least one of the at least one contact pad through the second-inter insulation layer.

14. The semiconductor memory device of claim 13, the second conductive layer further disposed on the gate capping layer of the adjacent ones of the at least two gate structures, an upper surface of the second conductive layer having a curved shape.

15. The semiconductor memory device of claim 13, the first conductive layer and the second conductive layer comprising epitaxial silicon layers.

16. The semiconductor memory device of claim 13, the insulation layer comprising a thermal oxidation layer.

17. The semiconductor memory device of claim 13, the insulation layer comprising a high dielectric layer.

18. The semiconductor memory device according to claim 13, the insulation layer comprising a gate insulation layer disposed between the gate electrode and the semiconductor substrate and a gate spacer disposed on sidewalls of the gate electrode, wherein a thickness difference between the gate insulation layer and the gate spacer is less than 7 nm.

* * * * *